United States Patent
Sato

(10) Patent No.: US 8,558,627 B2
(45) Date of Patent: Oct. 15, 2013

(54) SURFACE MOUNT CRYSTAL OSCILLATOR AND SUBSTRATE SHEET

(75) Inventor: Masashi Sato, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 44 days.

(21) Appl. No.: 13/337,555

(22) Filed: Dec. 27, 2011

(65) Prior Publication Data

US 2012/0161882 A1    Jun. 28, 2012

(30) Foreign Application Priority Data

Dec. 28, 2010 (JP) ............... P.2010-291707
Jul. 7, 2011 (JP) ............... P.2011-150616
Nov. 16, 2011 (JP) ............... P.2011-250754

(51) Int. Cl.
  *H03B 1/00* (2006.01)
  *H03B 5/32* (2006.01)
  *H01L 41/053* (2006.01)

(52) U.S. Cl.
  USPC ............ 331/68; 331/158; 310/344; 310/348; 310/368

(58) Field of Classification Search
  USPC ................. 310/311, 344, 348, 365, 366, 368; 331/46, 68, 154, 158
  See application file for complete search history.

(56) References Cited

U.S. PATENT DOCUMENTS

| | | | | |
|---|---|---|---|---|
| 4,757,581 A | * | 7/1988 | Yamada et al. | 29/25.35 |
| 5,585,687 A | * | 12/1996 | Wakabayashi et al. | 310/366 |
| 5,920,142 A | * | 7/1999 | Onishi et al. | 310/313 R |
| 6,274,968 B1 | * | 8/2001 | Wajima et al. | 310/348 |
| 6,369,487 B1 | * | 4/2002 | Kameda et al. | 310/320 |
| 6,452,311 B1 | * | 9/2002 | Serizawa | 310/363 |
| 7,538,627 B2 | * | 5/2009 | Moriya | 331/68 |
| 8,289,089 B2 | * | 10/2012 | Sato et al. | 331/68 |
| 8,299,859 B2 | * | 10/2012 | Sato et al. | 331/68 |
| 8,305,150 B2 | * | 11/2012 | Sakaba et al. | 331/68 |

FOREIGN PATENT DOCUMENTS

| | | |
|---|---|---|
| JP | 04-217108 | 8/1992 |
| JP | 04-296110 | 10/1992 |

* cited by examiner

*Primary Examiner* — Levi Gannon
(74) *Attorney, Agent, or Firm* — Jacobson Holman PLLC

(57) ABSTRACT

Provided is a surface mount crystal oscillator and a substrate sheet to prevent a decrease in a frequency variable amount by reducing electrostatic capacitance of the crystal oscillator. The surface mount crystal oscillator and the substrate sheet are each configured such that one end of a crystal holding terminal is connected to a corner terminal, and another end of the crystal holding terminal is formed from a center of a short side to be shorter than the one end so as to form an area in which no pattern is formed, and a pattern of a GND terminal is formed on that portion of a rear surface of a substrate which is opposed to the area in which no pattern is formed, so that the pattern (a crystal-mounted pattern) of the crystal holding terminal and the pattern of the GND terminal are not opposed to each other across the substrate.

4 Claims, 3 Drawing Sheets

SURFACE MOUNT CRYSTAL OSCILLATOR AND SUBSTRATE SHEET

This application has a priority of Japanese no. 2010-291707 filed Dec. 28, 2010, no. 2011-150616 filed Jul. 7, 2011, and no. 2011-250754 filed Nov. 16, 2011 hereby incorporated by reference.

BACKGROUND OF THE INVENTION

1. Field of the Invention

The present invention relates to a surface mount crystal oscillator, and more specifically, to a surface mount crystal oscillator and a substrate sheet each of which prevents a decrease in a frequency variable amount by reducing electrostatic capacitance of a crystal oscillator.

2. Description of the Related Art

[Prior Art]

A surface mount crystal oscillator is small in size and light in weight. In view of this, the surface mount crystal oscillator is provided, particularly, in portable electronic devices as a frequency or time reference standard.

Some conventional surface mount crystal oscillators are configured such that a crystal blank is mounted on a ceramic substrate and a cover having a recessed shape is provided upside down to cover the crystal blank so that the crystal blank is sealed and encapsulated therein. In recent years, there have been inexpensive oscillators for consumer use having a frequency deviation $\Delta f/f$ which is relatively loosely regulated, for example, from ±150 to ±250 ppm.

In the conventional surface mount crystal oscillators, a crystal holding terminal for holding a crystal blank is formed on a front surface on which the crystal blank is mounted.

Further, on a rear surface of the surface mount crystal oscillator, patterns of ground (GND) terminals are formed at two portions generally.

[Related Art]

Note that, as related conventional techniques, there are Japanese Patent Application Laid-Open No. 04-217108 "Chip-type Piezoelectric Component" (Murata Manufacturing Co., Ltd.) [Patent Document 1], and Japanese Patent Application Laid-Open No. 04-296110 "Production Method of Piezoelectric Resonant Element" (Murata Manufacturing Co., Ltd.) [Patent Document 2].

Patent Document 1 discloses that an input electrode and an output electrode are provided so as not to face each other via an interposing substrate and they are placed with a considerable distance therebetween.

Patent Document 2 discloses that in a large-thickness portion of a piezoelectric substrate, those portions of electrodes which are not opposed to each other are made large in area, while in a small-thickness portion of the piezoelectric substrate, those portions of the electrodes which are not opposed to each other are made small in area, so that the volume of floating capacitance caused between the non-opposed portions of the electrodes is adjusted to restrain unevenness in resonant frequency.

[Patent Document 1] Japanese Patent Application Laid-Open No. 04-217108

[Patent Document 2] Japanese Patent Application Laid-Open No. 04-296110

However, the above conventional surface mount crystal oscillators have such a problem that a patterned portion of a crystal holding terminal formed on a front surface of a substrate and a patterned portion of a GND terminal formed on a rear surface of the substrate overlap each other across the substrate (a base material) and are opposed to each other, thereby causing an increase in electrostatic capacitance C0 of the crystal oscillator, which leads to a decrease in a frequency variable amount.

More specifically, the electrostatic capacitance is determined by the areas of metal plates, the distance between the metal plates, and the dielectric constant of an insulator provided between the metal plates.

Further, as for the crystal oscillator, a larger frequency variable amount may be required by clients in some cases. In this regard, since the frequency variable amount $\Delta F/F$ is given in accordance with $\Delta F/F=C1/2(CL+C0)$, the increase in the electrostatic capacitance C0 will lead to the decrease in the frequency variable amount.

SUMMARY OF THE INVENTION

The present invention is accomplished in view of the above problems, and an object of the present invention is to provide a surface mount crystal oscillator and a substrate sheet each of which prevents a decrease in a frequency variable amount by reducing electrostatic capacitance of the crystal oscillator.

In order to solve the problems of the conventional examples, the present invention is a surface mount crystal oscillator in which: through holes are formed at four corners of a substrate on which a crystal blank is mounted; through terminals for causing inner surfaces of the through holes to be conductive are formed; on the substrate on which the crystal blank is mounted, a first crystal holding terminal is formed parallel to a short side of the substrate and a second crystal holding terminal is formed parallel to another short side of the substrate; one end of the first crystal holding terminal is connected to a corner terminal which is connected to any of the through terminals, and another end of the first crystal holding terminal is formed from a center of the short side to be shorter than the one end so as to form an area in which no pattern is formed; one end of the second crystal holding terminal is connected to a corner terminal which is connected to any of the through terminals, and another end of the second crystal holding terminal is formed from a center of the short side to be shorter than the one end so as to form an area in which no pattern is formed; and patterns of ground terminals are formed on those portions of a rear surface of the substrate which are opposed to the areas in which no pattern is formed.

In the present invention, the patterns of the crystal holding terminals and the patterns of the ground terminals are not opposed to each other across the substrate, thereby making it advantageously possible to reduce electrostatic capacitance of the crystal oscillator and to prevent a decrease in a frequency variable amount.

In the present invention, the surface mount crystal oscillator is such that the corner terminal to which the first crystal holding terminal is connected and the corner terminal to which the second crystal holding terminal is connected are provided at opposite angles on the substrate.

In the present invention, the surface mount crystal oscillator is such that the first and second crystal holding terminals are each configured such that a ratio between a length from the center of the short side to an end portion thereof which is connected to the corner terminal and a length from the center of the short side to another end portion thereof which is not connected to any corner terminals is 3:2.

The present invention is a substrate sheet in a sheet-like form on which a plurality of surface mount crystal oscillators are formed, and on the substrate sheet, break lines which partition areas of individual surface mount crystal oscillators in a longitudinal direction and a lateral direction and through holes penetrating through the seat at places where the break lines intersect each other are formed; through terminals for causing inner surfaces of the through holes to be conductive are formed and corner terminals are formed so as to surround the through holes, while a first crystal holding terminal and a second crystal holding terminal are formed parallel to respective short sides in each of the areas; one end of the first crystal holding terminal is connected to its nearest corner terminal, and another end of the first crystal holding terminal is formed from a center of the short side to be shorter than the one end so as to form an area in which no pattern is formed; one end of the second crystal holding terminal is connected to its nearest corner terminal, and another end of the second crystal holding terminal is formed from a center of the short side to be shorter than the one end so as to form an area in which no pattern is formed; and patterns of ground terminals are formed on those portions of a rear surface which are opposed to the areas in which no pattern is formed. In the present invention, the patterns of the crystal holding terminals and the patterns of the ground terminals are not opposed to each other across the substrate, thereby making it advantageously possible to reduce electrostatic capacitance of the crystal oscillator, to prevent a decrease in a frequency variable amount, and to facilitate frequency inspection and adjustment by use of the ground terminals.

In the present invention, the substrate sheet is such that: the corner terminal to which the first crystal holding terminal is connected and the corner terminal to which the second crystal holding terminal is connected are provided at opposite angles in the each of the areas.

In the present invention, the substrate sheet is such that the first and second crystal holding terminals are each configured such that a ratio between a length from the center of the short side to an end portion thereof which is connected to the corner terminal and a length from the center of the short side to another end portion thereof which is not connected to any corner terminals is 3:2.

DESCRIPTION OF REFERENCE NUMERALS

1 . . . Substrate, 2a, 2b, 2d . . . Corner terminal, 2c . . . Through terminal, 3 . . . Crystal holding terminal, 4 . . . Mounting terminal, 4a . . . GND terminal, 4b . . . Mounting electrode terminal, 5 . . . Crystal blank, 6 . . . Metal cover, 7 . . . Conductive adhesive, 8 . . . Sealant

DESCRIPTION OF THE PREFERRED EMBODIMENT

Embodiments of the present invention are described with reference to drawings.
[Summary of Preferred Embodiment]
A surface mount crystal oscillator according to an embodiment of the present invention is configured such that one end of a first crystal holding terminal is connected to a corner terminal, and another end of the first crystal holding terminal is formed from a center of a short side to be shorter than the one end so as to form an area in which no pattern is formed; one end of a second crystal holding terminal is connected to a corner terminal, and another end of the second crystal holding terminal is formed from a center of a short side to be shorter than the one end so as to form an area in which no pattern is formed; and patterns of ground terminals are formed on those portions on a rear surface of the substrate which are opposed to the areas where no pattern is formed. In this configuration, the patterns of the crystal holding terminals and the patterns of the ground terminals are not opposed to each other across the substrate, thereby resulting in that electrostatic capacitance of the crystal oscillator can be reduced and a decrease in a frequency variable amount can be prevented.

Figure 1:
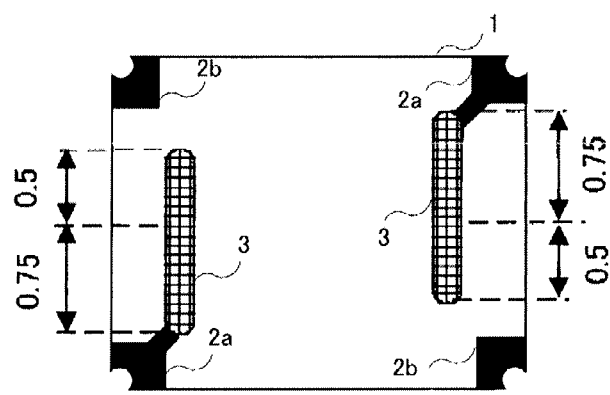
FIG. 1 is a plane explanatory view of a crystal-mounted pattern according to an embodiment of the present invention.

Further, a substrate sheet (a ceramic sheet) for a surface mount crystal oscillator according to the embodiment of the present invention is configured such that: in an area partitioned by break lines on a front surface of the substrate sheet, a crystal holding terminal which is connected to a corner terminal formed around a through hole is not connected to other corner terminals; and in the area partitioned by the break lines on a rear surface of the substrate sheet, a mounting terminal which is connected to a corner terminal formed around a through hole is also not connected to other corner terminals. This makes it advantageously possible to facilitate check and adjustment of frequency by use of the mounting terminal within the area.
[Crystal-Mounted Pattern: FIG. 1]

A crystal-mounted pattern of a surface mount crystal oscillator (the present oscillator) according to an embodiment of the present invention is described with reference to FIG. 1. FIG. 1 is a plane explanatory view of the crystal-mounted pattern according to the embodiment of the present invention.

As shown in FIG. 1, the crystal-mounted pattern of the present oscillator is arranged such that: corner terminals 2a and 2b which are connected to through terminals formed at the four corners of a substrate 1 are provided; and two crystal holding terminals (the crystal-mounted pattern) 3 are formed parallel to short sides of the substrate.

Note that the crystal holding terminals 3 correspond to the first crystal holding terminal and the second crystal holding terminal in Claims.

The surface mount crystal oscillator of FIG. 1 is a type referred to as "two-sides-holding".

Here, the corner terminal 2a is adapted to be connected to the crystal holding terminal 3, but the corner terminal 2b is adapted not to be connected to the crystal holding terminal 3.

Thus, for the corner terminal 2a, a connection pattern to be connected to the crystal holding terminal 3 is formed.

Further, as a characteristic part of the present oscillator, the crystal holding terminal 3 is not symmetric with respect to a center of a short side of the substrate 1, but is arranged such that an end portion thereof which is not connected to the corner terminal 2a is formed short.

More specifically, when a side of the crystal holding terminal 3 which is connected to the corner terminal 2a is 0.75 in a ratio in length from the middle (the center), another side of the crystal holding terminal 3 which is not connected to any corner terminals is 0.5 in the ratio in length from the center. That is, the ratio in length between these sides is 3:2.

Thus, in FIG. 1, an area in which no crystal-mounted pattern is formed is provided on an upper-left part of FIG. 1, while an area in which no crystal-mounted pattern is formed is provided on a lower-right part of FIG. 1, similarly.

Figure 2:
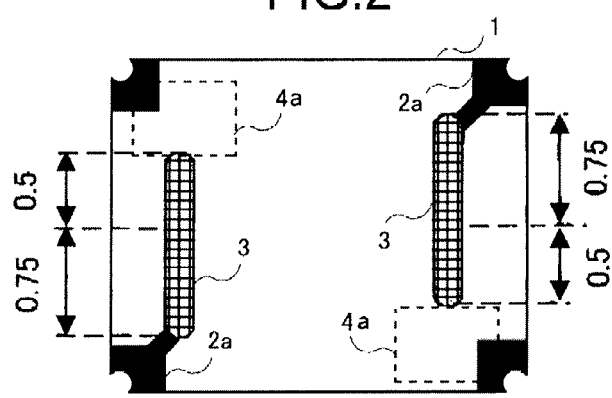
FIG. 2 is a plane explanatory view showing patterns of GND terminals from a front surface of a substrate.

[Patterns of GND Terminals: FIG. 2]

Next will be explained a pattern of a GND terminal 4a of a mounting terminal 4 formed on a rear surface of the substrate 1 with reference to FIG. 2. FIG. 2 is a plane explanatory view showing patterns of GND terminals from the front surface of the substrate.

As shown in FIG. 2, the pattern of the GND terminal 4a is formed on the rear surface of the substrate 1 in an area in which the pattern does not overlap with the crystal-mounted pattern. In FIG. 2, parts surrounded by dotted lines indicate the pattern of the GND terminal 4a.

That is, the dimensions of the pattern of the GND terminal 4a and the crystal-mounted pattern are adjusted so that the pattern of the GND terminal 4a and the crystal-mounted pattern are not opposed to each other via the substrate (base material) 1.

With such a configuration, since the pattern of the GND terminal 4a and the crystal-mounted pattern are not opposed to each other via the substrate 1, the electrostatic capacitance can be reduced, thereby making it advantageously possible to prevent a decrease in a frequency variable amount.

Figure 3:
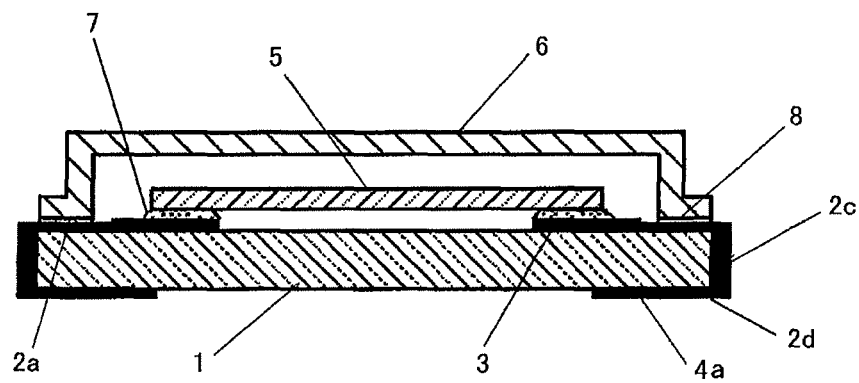
FIG. 3 is a cross-sectional explanatory view of the present oscillator.

[Configuration of the Present Oscillator: FIG. 3]

Next will be explained the configuration of the present oscillator with reference to FIG. 3. FIG. 3 is a cross-sectional explanatory view of the present oscillator.

As shown in FIG. 3, the present oscillator is configured such that a crystal blank 5 is mounted, via conductive adhesives 7, on the crystal holding terminals 3 formed on a ceramic base (the substrate) 1, and further, a metal cover (cover) 6 having a recessed shape is provided upside down on the ceramic base 1 to be bonded thereto so that the crystal blank 5 is sealed and enclosed therein.

Further, through terminals 2c are formed on side surfaces of the substrate 1, the corner terminals 2a and 2b are connected to the through terminals 2c on the front surface of the substrate 1, and the GND terminal 4a is connected to either of the through terminals 2c on the rear surface of the substrate 1 via a corner terminal 2d.

Then, the corner terminal 2a is connected to the crystal holding terminal 3 formed on the front surface of the substrate 1.

The through terminal 2c are formed on side walls of through holes formed at the four corners of the substrate 1.

Further, between the substrate 1 and its contact portion of the cover 6, a sealant 8 having an insulation property is formed.

Note that the corner terminals, the through terminals, and the GND terminals are formed of alloy of Ag (silver) and Pd (palladium).

Figure 4:
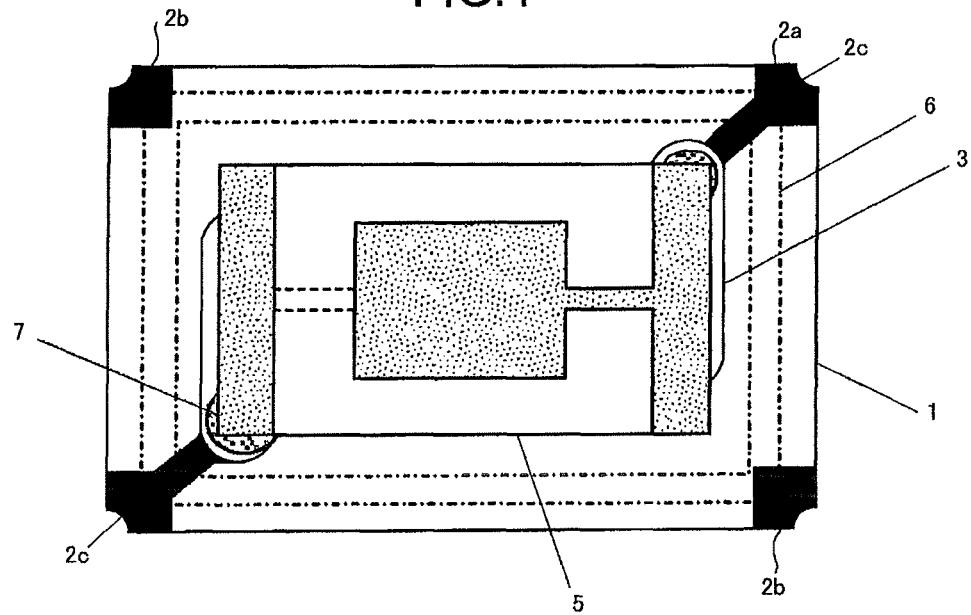
FIG. 4 is a plane explanatory view of the present oscillator.

[Planar Feature of the Present Oscillator: FIG. 4]

Next will be explained a planar feature of the present oscillator with reference to FIG. 4. FIG. 4 is a plane explanatory view of the present oscillator.

As shown in FIG. 4, the present oscillator is configured such that: crystal holding terminals 3 for holding both ends of a crystal blank 5 are formed on a ceramic base (a substrate) 1 so as to be opposed to each other; and corner terminals 2a each including a lead-out pattern extended from an end portion of a corresponding crystal holding terminal 3 toward its nearest corner portion of the substrate 1 are formed so as to be connected to a corresponding through terminal 2c.

That is, two corner terminals 2a are formed at opposite angles on the substrate 1, and connected to respective through terminals 2c. Further, two corner terminals 2b are also formed at opposite angles on the substrate 1, and connected to respective through terminals 2c.

The reason why the crystal holding terminal 3 is connected to the through terminal 2c via the corner terminal 2a having a lead-out pattern leading to a corner portion of the substrate 1 is as follows: it is possible to take a longer distance in comparison with a case where a lead-out pattern is led to a horizontal direction or a vertical direction of the substrate 1, thereby preventing that the crystal holding terminal 3 and the through terminal 2c short-circuit via the metal cover 6 even if a position of the metal cover 6 is misaligned.

The crystal blank 5 and the crystal holding terminal 3 are connected by the conductive adhesive 7 at that end portion of the crystal holding terminal 3 to which the lead-out pattern of the corner terminal 2a is connected.

As shown in FIG. 4, the present oscillator has such a structure that the crystal blank 5 is held by the crystal holding terminals 3 at both ends of the crystal blank 5, and therefore is referred to as a "two-sides-holding" type.

As has been already described in FIG. 1 and FIG. 2, the patterns of the crystal holding terminals 3 are arranged such that: as also shown in FIG. 4, they are formed so as to be opposed to each other across the center of the substrate 1, one end portions thereof which are not connected to any corner terminals 2a are provided shorter only by a specific length than in conventional crystal holding terminals.

The conventional crystal holding terminal is formed such that both sides thereof are formed to have the same length from the center of a short side of the substrate 1, whereas in the present oscillator, one side of the crystal holding terminal 3 which side is not connected to any corner terminals 2a are provided short in length.

This configuration is to prevent that the patterns of the GND terminals 4a on the rear surface of the substrate 1 and the patterns (the crystal-mounted pattern) of the crystal holding terminals on the front surface of the substrate are not opposed to each other. In addition to that, even if the metal cover 6 comes in contact with one of the crystal holding terminals 3, the configuration prevents that the metal cover 6 comes into contact with the other (different) crystal holding terminal 3, thereby avoiding short circuits.

Figure 5:
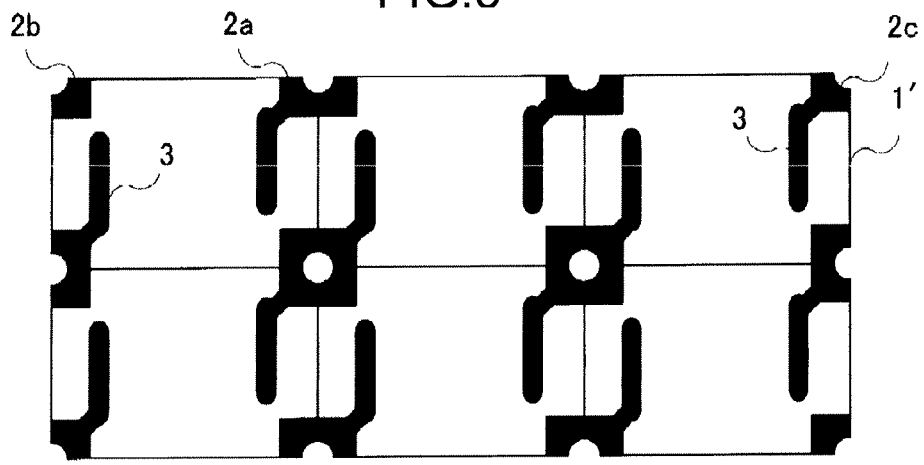
FIG. 5 is a schematic diagram showing a front surface of a ceramic sheet for the present oscillator.

[Front Surface of Ceramic Sheet of the Present Oscillator: FIG. 5]

Next will be explained a front surface of a substrate sheet (a ceramic sheet) on which the present oscillator is formed, with reference to FIG. 5. FIG. 5 is an explanatory view of the front surface of the ceramic sheet of the present oscillator.

As shown in FIG. 5, on a front surface of a ceramic sheet 1', break lines are formed in longitudinal and lateral directions to divide the ceramic sheet 1' into substrates 1, and through holes are formed at intersections of the break lines.

Then, corner terminals 2 (2a, 2b) are formed around the through holes so as to surround the through holes.

Crystal holding terminals 3 are formed along short sides of the break lines, one ends of the crystal holding terminals 3 are connected to the corner terminals 2a, and another ends of the crystal holding terminals 3 are not connected to any corner terminals 2b.

Further, as has been described in FIG. 1, the another end (the end portion which are near to the corner terminals 2b) of the crystal holding terminal is short in length from the center, so that a blank area with no pattern is formed between the crystal holding terminal and the corner terminal 2b.

Further, as shown in FIG. 5, the corner terminals 2 at a pair of opposite angles are connected to the crystal holding terminals 3, but the corner terminals 2 at the other pair of opposite angles are not connected to the crystal holding terminals 3. That is, any adjacent corner portions are not connected to the crystal holding terminals 3 at the same time.

Figure 6:
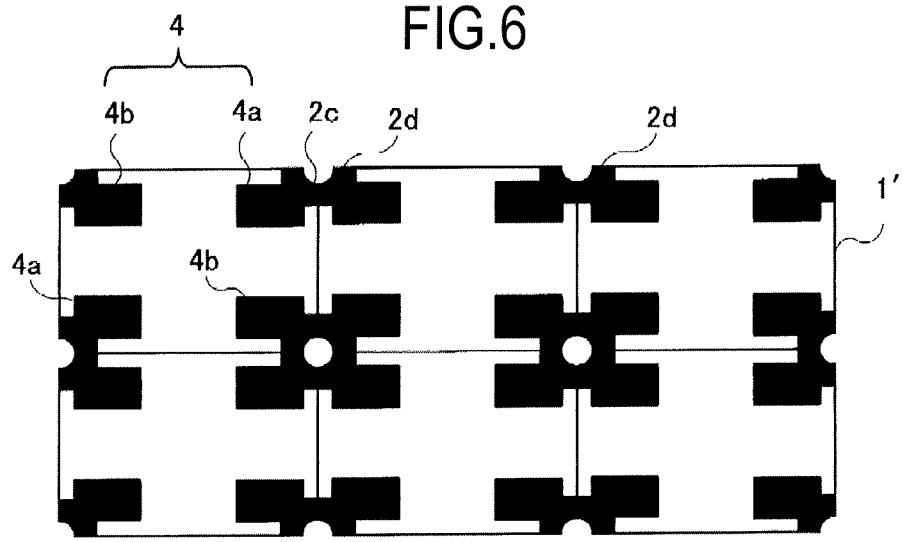
FIG. 6 is a schematic diagram showing a rear surface of the ceramic sheet for the present oscillator.

[Rear Surface of Ceramic Sheet of the Present Oscillator: FIG. 6]

Next will be described a rear surface of the ceramic sheet on which the present oscillator is formed with reference to FIG. 6. FIG. 6 is an explanatory view of the rear surface of the ceramic sheet of the present oscillator.

As shown in FIG. 6, on the rear surface of ceramic sheet 1', break lines are formed, and through holes are formed at intersections of the break lines.

Then, corner terminals 2d are formed around the through holes so as to surround the through holes.

GND terminals 4a and mounting electrode terminals 4b of mounting terminals 4 are formed so as to be connected to corner portions of the corner terminals 2d.

Further, as shown in FIG. 6, the corner terminals 2d at a pair of opposite angles are connected to the GND terminals 4a, and the corner terminals 2d at the other pair of opposite angles are connected to the mounting electrode terminals 4b. That is, any adjacent corner portions are not connected to the GND terminals 4a at the same time, and similarly, any adjacent corner portions are not connected to the mounting electrode terminals 4b at the same time.

When the front surface and the rear surface of the ceramic sheet 1' are configured as such, frequency adjustment and check can be performed appropriately in a state of the ceramic sheet 1' before it is divided into individual substrates 1.

In the configurations of the front and rear surfaces of the ceramic sheet 1', the crystal holding terminals 3 and the mounting terminals 4 which are connected to a given corner terminal 2 (2a, 2d) are electrodes having in common with respect to one corner terminal 2. However, they are not connected to the other corner terminals, so that individual corner terminals 2 are electrically independent from each other. This allows frequency check and adjustment to be performed appropriately. Particularly, in an area partitioned by break lines, when a measuring terminal is made contact with the mounting terminal 4, it is not affected by the other areas. Accordingly, the frequency check and adjustment can be performed appropriately.

The check of the frequency is to measure a frequency characteristic of a crystal oscillator formed on the front surface of the ceramic sheet 1' by making a measuring terminal contact with the mounting terminal 4 in the area partitioned by break lines on the rear surface of the ceramic sheet 1'.

Further, the adjustment of the frequency is performed by processing a drive electrode of the crystal blank 5 in a state where the frequency characteristic of the crystal oscillator is measured. The adjustment of the frequency will be described later.

[Production Method of Ceramic Sheet]

A production method of the ceramic sheet is described below.

The ceramic sheet (a substrate sheet) before it is divided into individual substrates 1 is formed of ceramic, and break lines and through holes for dividing the ceramic sheet into individual substrates 1 are formed on the ceramic sheet.

The break lines are to partition areas of adjacent substrates 1 and make it easy to divide produced surface mount crystal oscillators into pieces.

The through holes are formed at places (four corners [corner portions] of the substrate 1) where the break lines intersect each other.

Then, on a rear surface of the ceramic sheet 1', patterns of corner terminals 2d and GND terminals 4 are formed by printing by use of a mask pattern around the through holes. In FIG. 6, the corner terminal 2d is formed in a doughnut shape so as to surround a through hole.

The patterns of the corner terminals 2d and the mounting terminals 4 are formed by printing metallic paste of AgPd alloy with a thickness of around 10 μm, and then burning the metallic paste. When the patterns are formed, through terminals 2c in the through holes are formed from the back side.

The connection relation between the corner terminal 2d and the GND terminal 4a is as described with reference to FIG. 2 and FIG. 6.

Further, on the front surface of the ceramic sheet 1', patterns of corner terminals 2a and 2b and crystal holding terminals 3 are formed around the through holes. The patterns on the front surface are also formed by the same method as the patterns on the rear surface. When the patterns are formed, through terminals 2c in the through holes are also formed from the front side.

Note that the patterns in the ceramic sheet 1' are formed by printing, but may be formed by electroless plating.

After the patterning on the front surface and the rear surface of the ceramic sheet 1', an insulator film is formed, crystal blanks 5 are mounted thereon, and the frequency check and frequency adjustment are performed. Subsequently, the ceramic sheet 1' is sealed by metal covers, and divided into individual surface mount crystal oscillators along the break lines.

The frequency check and the frequency adjustment are performed specifically in such a manner that on the rear surface of the ceramic sheet 1', a measuring terminal (a probe) from a measuring apparatus is made contact with each of the mounting terminals 4 which are electrically connected to the crystal blank 5 in an area partitioned by the break lines.

The frequency check is performed such that the frequency characteristic of a crystal oscillator formed on the front surface of the ceramic sheet 1' is measured in a state where the measuring terminals have contact with the mounting terminals 4.

Then, the frequency adjustment is performed such that in a state where the frequency characteristic of the crystal oscillator is measured, a drive electrode provided on a front surface of the crystal blank 5 on which surface a plate surface is exposed is irradiated with gas ions to scrape off the front surface, so that the oscillation frequency is adjusted from low to high by reducing the mass of the drive electrode.

Note however that the oscillation frequency can be adjusted from high to low, for example, by adding a metal film on the drive electrode by vapor deposition and sputtering.

Effects of Embodiments

According to the present oscillator, one end of a crystal holding terminal 3 is connected to a corner terminal 2a, and another end of the crystal holding terminal 3 is formed from a center of a short side to be shorter than the one end so as to form an area in which no pattern is formed, and a pattern of a ground terminal 4a is formed on a portion on a rear surface of a substrate 1 which portion is opposed to the area where no pattern is formed. Thus, the pattern (a crystal-mounted pattern) of the crystal holding terminal and the pattern of the GND terminal 4a are not opposed to each other across the substrate 1, thereby making it advantageously possible to reduce electrostatic capacitance of the crystal oscillator and to prevent a decrease in a frequency variable amount.

According to the ceramic sheet 1' for the present oscillator, in an area partitioned by break lines on a front surface of the ceramic sheet 1', a crystal holding terminal 3 connected to a corner terminal 2a formed around a through hole is not connected to the other corner terminals 2b, and in the area partitioned by break lines on a rear surface thereof, a mounting terminal 4 connected to a corner terminal 2d formed around the through hole is not connected to the other corner terminals, thereby making it advantageously possible to facilitate check and adjustment of frequency by use of the mounting terminal 4 in the above area.

The present invention is preferably applied to a surface mount crystal oscillator and a substrate sheet each of which can prevent a decrease in a frequency variable amount by reducing electrostatic capacitance of the crystal oscillator.

What is claimed is:

1. A surface mount crystal oscillator, wherein:
through holes are formed at four corners of a substrate on which a crystal blank is mounted;
through terminals for causing inner surfaces of the through holes to be conductive are formed;
corner terminals are formed around the through holes so as to surround the through holes and connected to the through terminals;
on the substrate on which the crystal blank is mounted, a first crystal holding terminal is formed parallel to a short side of the substrate and a second crystal holding terminal is formed parallel to another short side of the substrate;
one end of the first crystal holding terminal is led toward its nearest corner and connected to a corner terminal at the corner, and another end of the first crystal holding terminal is formed from a center of the short side to be shorter than the one end so as to form an area in which no pattern is formed;
one end of the second crystal holding terminal is led toward its nearest corner and connected to a corner terminal at the corner, and another end of the second crystal holding terminal is formed from a center of the short side to be shorter than the one end so as to form an area in which no pattern is formed;
on a rear surface of the substrate, ground terminals are formed not to overlap with the first crystal holding terminal and the second crystal holding terminal; and
the corner terminal to which the first crystal holding terminal is connected and the corner terminal to which the second crystal holding terminal is connected are provided at opposite corners of the substrate.

2. The surface mount crystal oscillator according to claim 1, wherein the first and second crystal holding terminals are each configured such that a ratio between a length from the center of the short side to an end portion thereof which is connected to the corner terminal and a length from the center of the short side to another end portion thereof which is not connected to any corner terminals is 3:2.

3. A substrate sheet in a sheet-like form on which a plurality of surface mount crystal oscillators are formed, wherein:
on the substrate sheet, break lines which partition areas of individual surface mount crystal oscillators in a longitudinal direction and a lateral direction and through holes penetrating through the sheet at places where the break lines intersect each other are formed;
through terminals for causing inner surfaces of the through holes to be conductive are formed and corner terminals are formed so as to surround the through holes, while a first crystal holding terminal and a second crystal holding terminal are formed parallel to respective short sides in each of the areas;
one end of the first crystal holding terminal is led toward its nearest corner of an area of an individual surface mount crystal oscillator and connected to its nearest corner terminal, and another end of the first crystal holding terminal is formed from a center of the short side to be shorter than the one end so as to form an area in which no pattern is formed;
one end of the second crystal holding terminal is led toward its nearest corner of the area of the individual surface mount crystal oscillator and connected to its nearest corner terminal, and another end of the second crystal holding terminal is formed from a center of the short side to be shorter than the one end so as to form an area in which no pattern is formed;
on a rear surface of the substrate sheet, ground terminals are formed not to overlap with the first crystal holding terminal and the second crystal holding terminal; and
the corner terminal to which the first crystal holding terminal is connected and the corner terminal to which the second crystal holding terminal is connected are provided at opposite corners of the area of the individual surface mount crystal oscillator.

4. The substrate sheet according to claim 3, wherein the first and second crystal holding terminals are each configured such that a ratio between a length from the center of the short side to an end portion thereof which is connected to the corner terminal and a length from the center of the short side to another end portion thereof which is not connected to any corner terminals is 3:2.

* * * * *